(12) United States Patent
Ikeda

(10) Patent No.: US 6,876,060 B2
(45) Date of Patent: Apr. 5, 2005

(54) COMPLIMENTARY BIPOLAR TRANSISTOR

(75) Inventor: Tatsuhiko Ikeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/246,406

(22) Filed: Sep. 19, 2002

(65) Prior Publication Data

US 2003/0183903 A1 Oct. 2, 2003

(30) Foreign Application Priority Data

Mar. 28, 2002 (JP) ......................................... 2002-092622

(51) Int. Cl.[7] ......................... H01L 31/11; H01L 27/082
(52) U.S. Cl. ...................................... 257/566; 257/592
(58) Field of Search ................................ 257/552–576, 257/591–593; 438/201–223, 322

(56) References Cited

U.S. PATENT DOCUMENTS

| | | | |
|---|---|---|---|
| 4,951,115 A | | 8/1990 | Harame et al. |
| 5,406,113 A | * | 4/1995 | Horie .......................... 257/565 |
| 5,508,553 A | | 4/1996 | Nakamura et al. |
| 5,893,743 A | * | 4/1999 | Gomi et al. ................. 438/322 |
| 5,930,635 A | | 7/1999 | Bashir et al. |
| 6,333,237 B1 | * | 12/2001 | Yoshida ....................... 438/322 |
| 6,337,252 B1 | * | 1/2002 | Yoshida ....................... 438/359 |
| 6,563,147 B1 | | 5/2003 | Ikeda |

FOREIGN PATENT DOCUMENTS

| | | |
|---|---|---|
| JP | 02-272758 | 11/1990 |
| JP | 07-130864 | 5/1995 |
| JP | 07-147287 | 6/1995 |
| JP | 10-256389 | 9/1998 |
| JP | 10-326793 | 12/1998 |
| JP | 2000-031162 | 1/2000 |
| JP | 2001-168105 | 6/2001 |
| JP | 2001-267330 | 9/2001 |

OTHER PUBLICATIONS

J.D. Cressler, "SiGe HBT Technology: A New Contender for Si–Based RF and Microwave Circuit Applications", IEEE Transactions on Microwave Theory and Techniques, vol.46, No. 5, May 1998.

Yoshiaki Sano, "Fundamentals and Practice of Analog Integrated Circuit Design", Realize, p. 141–144.

* cited by examiner

*Primary Examiner*—Cuong Nguyen
(74) *Attorney, Agent, or Firm*—Burns, Doane, Swecker & Mathis, L.L.P.

(57) ABSTRACT

An NPN transistor having an epitaxial region of an N-type silicon/P-type silicon germanium/N-type silicon structure, and a PNP transistor having an epitaxial region of a P-type silicon/N-type silicon germanium/P-type silicon structure are formed on a silicon substrate after the formation of an element-isolating oxide film. At this time, the concentration distribution of germanium in the base of each of the NPN transistor and the PNP transistor is adjusted to have a peak in the collector side, and to descend toward the emitter side. Since each epitaxial layer is independently grown, the speed performance of each transistor can be adjusted to the ultimate while maintaining practical withstand voltage.

8 Claims, 18 Drawing Sheets

NPN transistor

PNP transistor

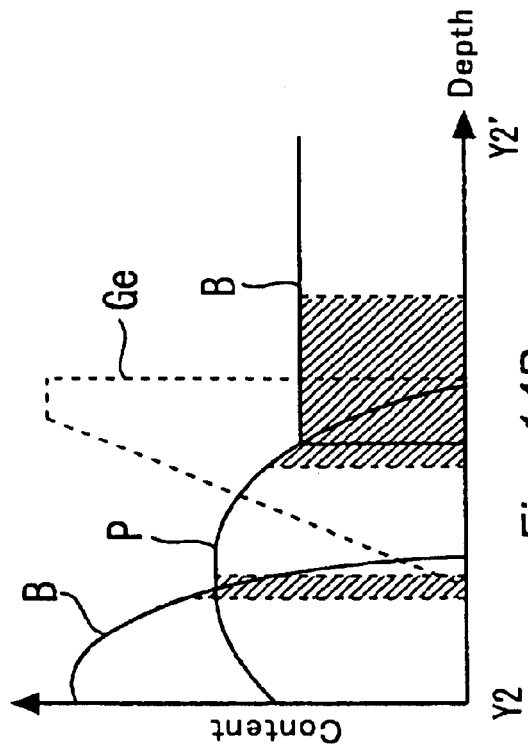
Fig. 14B  PNP transistor
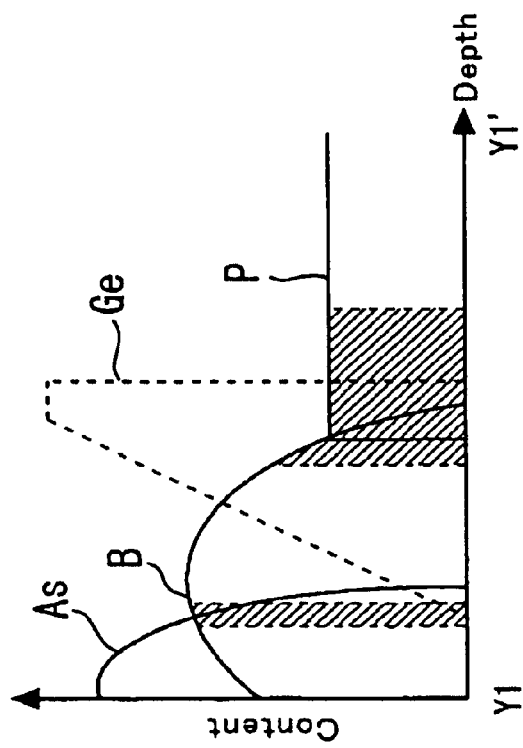
Fig. 14A  NPN transistor

COMPLIMENTARY BIPOLAR TRANSISTOR

BACKGROUND OF THE INVENTION

1. Field of the Invention

The present invention relates to a semiconductor device and a method for the manufacture thereof, and more specifically to a semiconductor device having an NPN bipolar transistor (hereinafter referred to as "NPN transistor") and a PNP bipolar transistor (hereinafter referred to as "PNP transistor") that perform high-frequency operation on a common silicon substrate and a method for the manufacture thereof.

2. Background Art

In recent years, the speed performance of bipolar transistors for high frequencies has rapidly been improved by forming epitaxial layers as the base layers with a heterojunction, such as silicon germanium (SiGe). In such ICs for high frequencies, if a PNP transistor having a speed performance equivalent to the speed performance of an NPN transistor is available, more versatile functions can be realized. FIG. 17 shows a high-power amplifier of a push-pull constitution (Yoshiaki Sano, "Fundamentals and Practice of Analog Integrated Circuit Design", Realize, p. 141). This example has a circuit constitution having an NPN transistor and a PNP transistor in each of the difference input stage, intermediate stage, and output stage, and each transistor needs the same degree of speed performance. If a PNP current mirror can be moved quickly, the application to a multistage amplifier of direct current coupling, not by capacitance coupling, can be considered. Therefore, a semiconductor device having a PNP transistor having a speed performance equivalent to the speed performance of an NPN transistor is strongly demanded.

As an example of semiconductor devices, wherein a vertical NPN bipolar transistor and a vertical PNP bipolar transistor each having a junction between an emitter, base and collector formed in the depth direction of a substrate, i.e., in the vertical direction of the substrate, are formed on the same substrate, Japanese Patent Laid-Open No. 2-272758 discloses a semiconductor device shown in FIG. 18. This device consists of a silicon substrate 10; an N+-type buried emitter layer 12; a P+-type buried collector layer 14; deep trench isolating insulation layers 30, 32 and 34; shallow trench isolation insulating layers 44, 46, 48, 50, and 52; P-type base layer 54; a P+-type base leading layer 92 72 an N-type collector layer 56; an N+-type collector leading layer 78; a P+-type emitter layer 98; a P+-type emitter leading layer 96; insulating films 80, 82, 92, and 112; a base electrode 104 of the NPN transistor; an emitter electrode 108 of the NPN transistor; a base electrode 106 of the PNP transistor; and a collector electrode 110 of the PNP transistor. In FIG. 18, the NPN transistor operates upwardly, and the PNP transistor operates As another example of semiconductor devices, wherein a vertical NPN bipolar transistor and a lateral PNP bipolar transistor each having a junction between an emitter, base, and collector formed in the direction perpendicular to the depth direction of a substrate, i.e., in the horizontal direction of the substrate, are formed on the same substrate, Japanese Patent No. 2565113 discloses a semiconductor device shown in FIG. 19. This device consists of a silicon substrate 1; an N+-type buried collector layer 2; an N--type epitaxial layer 3; an isolating oxide layer 4; an N+-type collector leading region 3'; an N-type collector region 11; P-type base regions 12, 44; an N+-emitter region 13; a P-type collector region 21; an N-type intrinsic base region 22; an N+-type hole stopper region 32; a P-type emitter region 23; P-type leading films 7 and 8; an N-type leading film 9; insulating films 5 and 6; a base electrode 14 of the NPN transistor; an emitter electrode 15 of the NPN transistor; a collector electrode 16 of the NPN transistor; a base electrode 24 of the PNP transistor; an emitter electrode 25 of the PNP transistor; and a collector electrode 26 of the PNP transistor. In FIG. 19, the NPN transistor operates downwardly, and the PNP transistor operates laterally.

For realizing high-speed operation, it is effective to shorten the time when the carrier passes through the base by narrowing the base width as much as possible. However, in the case of a vertical transistor as shown in FIG. 18, the base width of the NPN transistor is necessarily the same as the width of the collector of a low concentration of the PNP transistor. On the other hand, for obtaining a desired withstand voltage, the width of the collector of a low concentration cannot be narrowed than a predetermined value. Therefore, since the speed performance of a device is limited by the withstand voltage determined by the collector width, there is a problem of difficulty in forming a device that realizes high-speed performance while maintaining practical withstand voltage.

In a lateral transistor as shown in FIG. 19, since the base width depends on the resolution in the lithography process, and the formation of a narrow base width is difficult, there is a problem of speed performance inferior to the speed performance of a transistor of vertical operation. Furthermore, in a PNP transistor having the arrangement of the emitter and the collector as shown in FIG. 19, since the injection efficiency of the emitter cannot be raised, there is another problem of difficulty to obtain a high amplification ratio.

An example wherein a vertical NPN transistor and a vertical PNP transistor are formed on a single substrate (FIG. 20) is described in U.S. Pat. No. 5,930,635. In the structure shown in FIG. 20, however, if the base width is narrowed for high-speed operation, the base leading portions (portions indicated as p++SiGe and n++SiGe in FIG. 20) is also thinned, and there is a problem of the increase of the base resistance.

SUMMARY OF THE INVENTION

The present invention intends to solve these problems. The object of the present invention is to provide a semiconductor device having an ultra-high-speed NPN heterojunction bipolar transistor and an ultra-high-speed PNP heterojunction bipolar transistor of equivalent performance formed on a single substrate, and a method for manufacturing such a semiconductor device.

BRIEF DESCRIPTION OF THE DRAWINGS

FIG. 4(a) is to a NPN transistor, FIG. 4(b) is to a PNP transistor.

FIG. 5(a) is to a NPN transistor, FIG. 5(b) is to a PNP transistor.

FIG. 13(a) is to a NPN transistor, FIG. 13(b) is to a PNP transistor.

FIGS. 14A and 14B are each content profiles of germanium and impurities according to a forth embodiment of the invention. FIG. 14(a) is to a NPN transistor, FIG. 14(b) is to a PNP transistor.

FIG. 15(a) is to a NPN transistor, FIG. 15(b) is to a PNP transistor.

FIG. 16(a) is to a NPN transistor, FIG. 16(b) is to a PNP transistor.

DETAILED DESCRIPTION OF THE PREFERRED EMBODIMENTS

Figure 1:
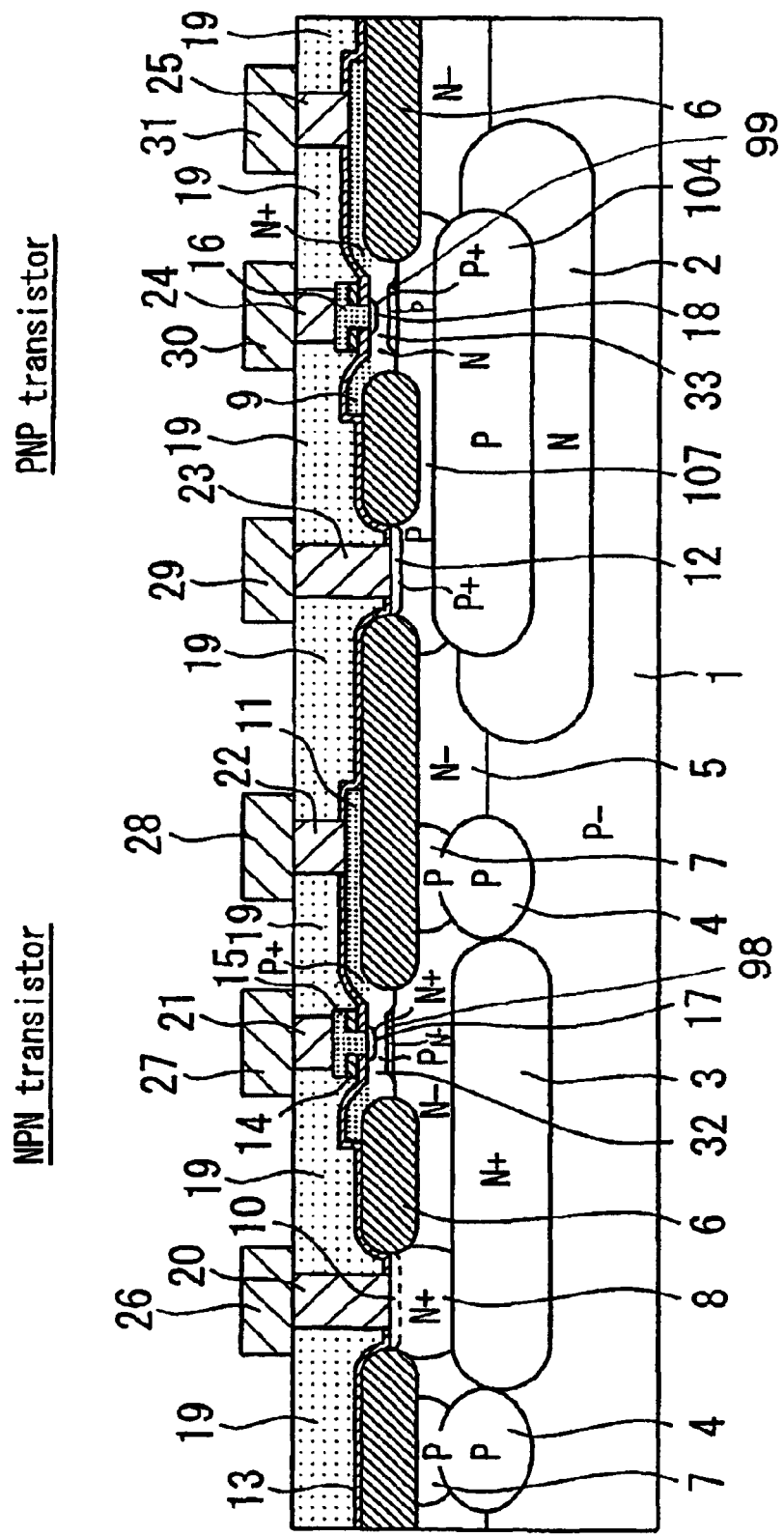
FIG. 1 is a sectional view of a semiconductor device according to a first embodiment of the invention.

The embodiments of the present invention will be described in detail below referring to the drawings.
First Embodiment FIG. 1 is a sectional view of a semiconductor device according to a First Embodiment of the present invention. The semiconductor device of FIG. 1 comprises a silicon substrate 1; an N-type isolating layer 2; an N+-type buried collector layer 3; P-type isolating layers 4 and 7; an N-type epitaxial layer 5; an element isolating oxide film 6; a P-type intrinsic base region 32; an N+-type emitter region 17; an N-type collector layer 98; N+-type collector leading regions 8 and 10; a P+-type base leading region 11; an N+-type emitter leading region 15; a P-type buried collector layer 104; a P-type collector region 107; an N-type intrinsic base region 33; a P+-type emitter region 18; P-type collector layer 99; a P+-type collector contact region 12; an N+-type base leading region 9; a P+-type emitter leading region 16; insulation films 13, 14, and 19; contact plugs 20, 21, 22, 23, 24, and 25; and electrodes 26, 27, 28, 29, 30, and 31. In FIG. 1, both the NPN transistor and the PNP transistor operate downwardly. In the present invention, each of the NPN transistor and the PNP transistor is characterized in that a P-type base layer and an N-type base layer are independently formed by independently growing an epitaxial layer on a silicon substrate. Thereby, the impurity profile in each base layer is determined by the impurity profile in the epitaxial layer, and a base width optimal to each transistor can be established. Namely, since the speed performance of each of the NPN transistor and the PNP transistor can be adjusted to the ultimate while maintaining a practical withstand voltage, a semiconductor device wherein an ultra-high-speed NPN transistor and an ultra-high-speed PNP transistor having an equal high-speed performance are formed on a common silicon substrate can be realized.

FIG. 2 shows the Fermi level $E_f$, the end of the valence band $E_v$, and the end of the conduction band $E_c$ of each of silicon (Si), germanium (Ge), and a silicon-germanium alloy (SiGe) (Si:Ge=1:1) in the cases of (a) containing no impurities, (b) containing a P-type impurity, and (c) containing an N-type impurity. The bandgap at room temperature is considered to be about 1.12 eV for silicon, about 0.66 eV for germanium, and the value almost intermediate between them for the $Si_{0.5}Ge_{0.5}$ alloy.

Figure 2A:
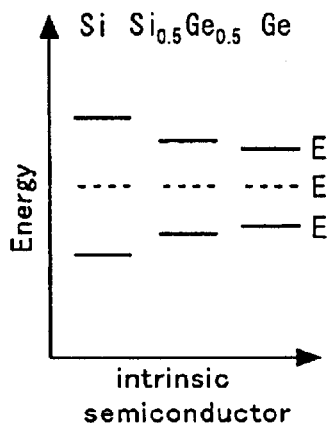
FIGS. 2A, 2B and 2C are each an energy-band diagram showing a first embodiment of the invention.
Figure 2B:
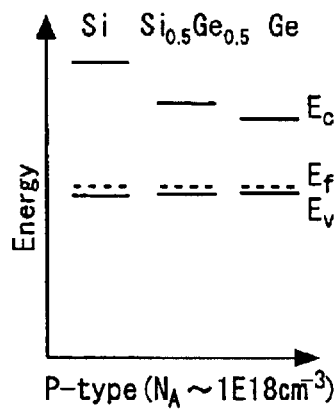
Figure 2C:
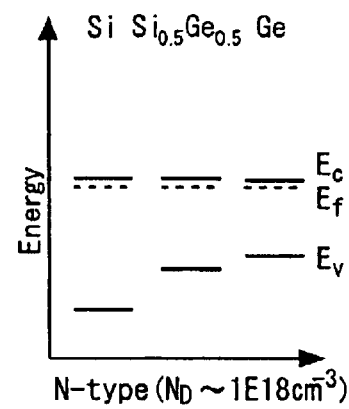

When no impurities are contained as shown in FIG. 2(a), the Fermi level is almost the middle of the band gaps. The Fermi level approaches the end of the valence band when a P-type impurity is introduced, and approaches the end of the conduction band when an N-type impurity is introduced. When the content of the P-type impurity is sufficiently high, as FIG. 2(b) shows, silicon and germanium has almost the same energy difference between the Fermi level and the end of the valence band, but has largely different energy difference between the Fermi level and the end of the conduction band. Whereas, when the content of the N-type impurity is sufficiently high, as FIG. 2(c) shows, silicon and germanium has almost the same energy difference between the Fermi level and the end of the conduction band, but has largely different energy difference between the Fermi level and the end of the valence band. The $Si_{0.5}Ge_{0.5}$ alloy behaves similarly in the middle between silicon and germanium.

Figure 3A:
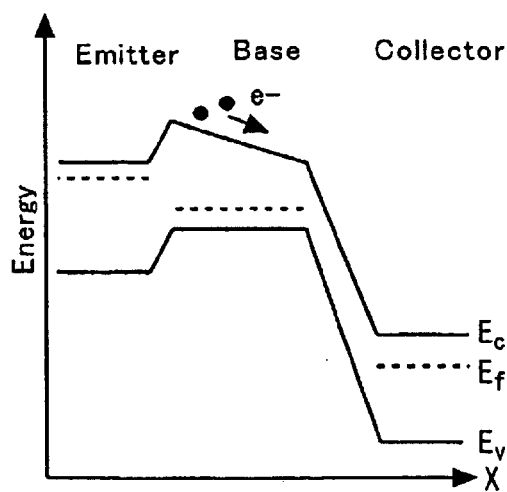
FIGS. 3A and 3b are each an energy-band diagram showing a first embodiment of the invention.
Figure 3B:
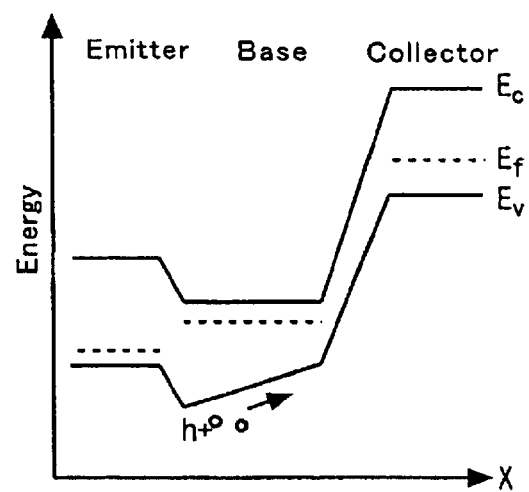

For an NPN heterojunction bipolar transistors having a silicon germanium base, a method for improving the speed performance by changing the germanium content in the base to apply an accelerated electric field has been known. As is shown in FIG. 3(a), the band diagram of an NPN transistor in operation, when the germanium content in the base (P-type) is made higher in the collector side than in the emitter side, the end of the conduction band inclines, and electrons are accelerated toward the collector. Similarly in a PNP transistor, when the germanium content in the base (N-type) is made higher in the collector side as FIG. 3(b) shows, the valence band inclines, and holes are accelerated toward the collector.

Figure 4A:
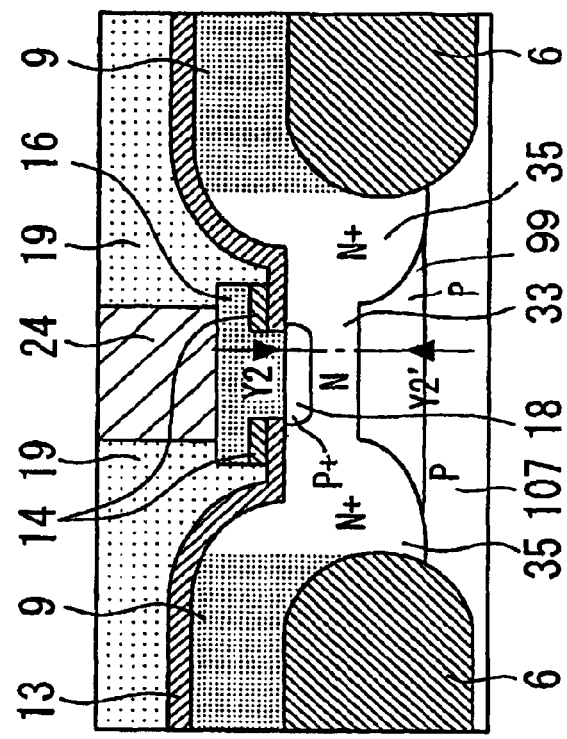
FIGS. 4A and 4B are each an enlarged diagram of emitter and base regions according to a first embodiment of the invention.
Figure 4B:
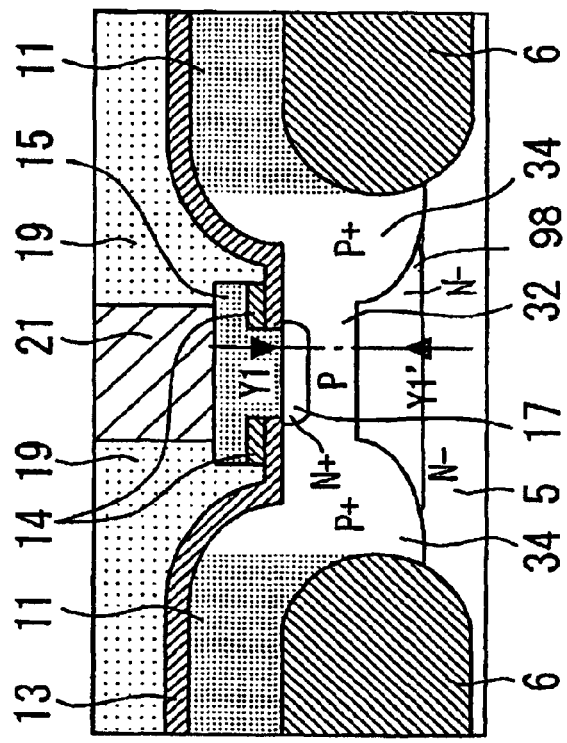

FIG. 4 shows enlarged diagrams of the emitter and the intrinsic base region of FIG. 1. FIG. 4(a) shows the NPN transistor and FIG. 4(b) shows the PNP transistor. In both diagrams, the base and the base leading region are integrated, and are polycrystalline in the region contacting the element isolating oxide film 6, and single-crystalline in the region contacting the silicon layer. In FIG. 4, the polycrystalline portion is indicated by scattered dots. A P-type external base region 34 is disposed at a portion where the P-type base 32 links to P-type base leading layers 11, and an N-type external base region 35 is disposed at a portion where the N-type base 33 links to N-type base leading layers 9.

Figure 5B:
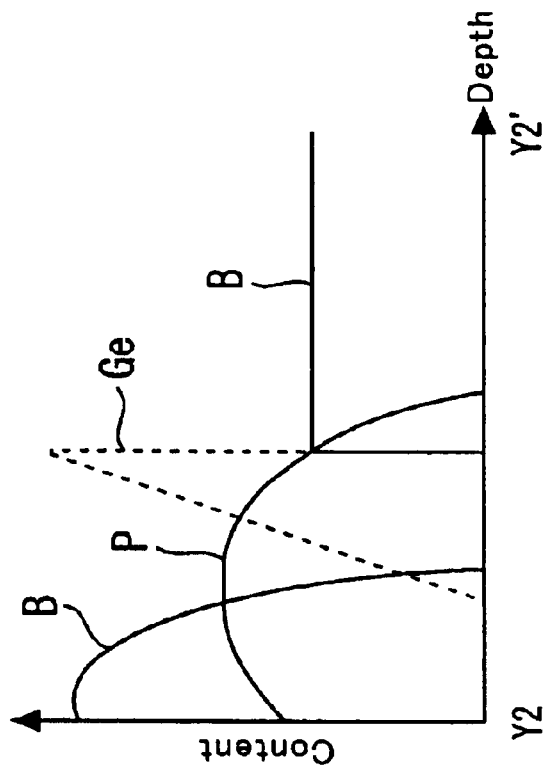
FIGS. 5A and 5B are each content profiles of germanium and impurities according to a first embodiment of the invention.
Figure 5A:
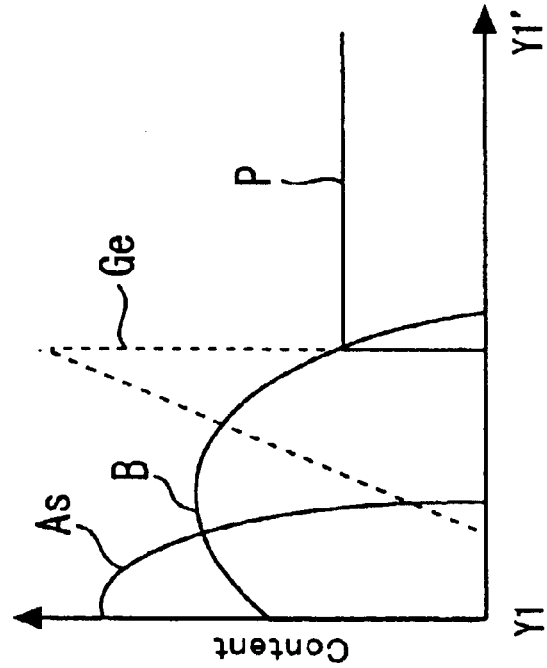

FIG. 5(a) shows the content profiles of germanium and impurities when the emitter portion 17 the base portion 32 and the collector portion 98 of the NPN transistor is cut along line Y1–Y1' in this order. Similarly, FIG. 5(b) shows the content profiles of germanium and impurities when emitter portion 18 base portion 33 and the collector portion 99 of the PNP transistor is cut along line Y2–Y2'. As the impurities, arsenic (As), boron (B) and phosphorus (P) are introduced in the emitter portion, the base portion and the collector portion of the NPN transistor, respectively. Germanium has a content distribution gradually decreasing from the collector side toward the emitter side so as to have the peak where the collector joins to the base, and to become zero where the emitter joins to the base. On the other hand, in the PNP transistor, boron (B) is introduced in the emitter portion and the collector portion, and phosphorus (P) is introduced the base portion as the impurities. Germanium has the content distribution as the above-described NPN transistor. By such content distribution of germanium, an accelerating electric field is applied to electrons in the base of the NPN transistor, while an accelerating electric field is applied to holes in the base of the PNP transistor, and a high-frequency operation at gigahertz (GHz) order can be realized.

Figure 6A:
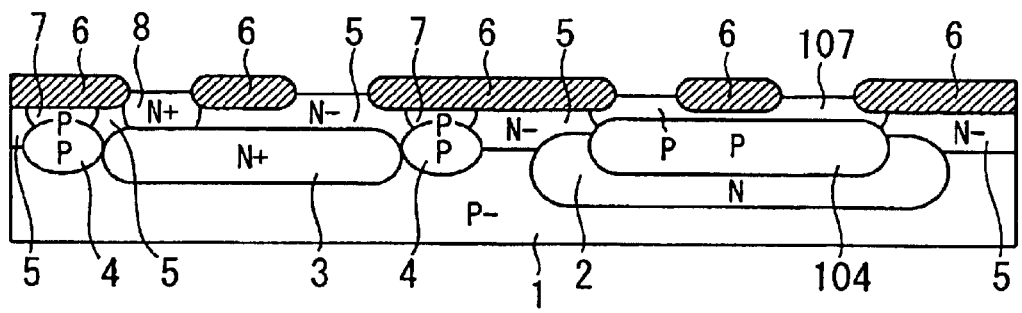
FIGS. 6a, 6b, 6c and 6D are each a schematic sectional view showing manufacturing steps of a semiconductor device according to a first embodiment of the invention.

Next, a method for manufacturing such a semiconductor device according to the present invention will be described below. Using known ion implantation, thermal diffusion, and thermal oxidation methods, an N-type isolating layer 2, an N+-type buried collector layer 3, P-type diffusion layers 4, and a P-type collector layer 104 are formed on a silicon substrate 1 (P-type semiconductor), then N--type silicon layers are epitaxially grown to form epitaxial layers 5; and element isolating oxide layers 6, P-type diffusion layers 7 and 107, and an N+-type collector leading layer 8 are formed to complete the state shown in FIG. 6(a) (Step 1). Here, the element isolating oxide layers 6 is an oxide layer for electrically insulating and isolating the NPN transistor from the PNP transistor.

Figure 10:
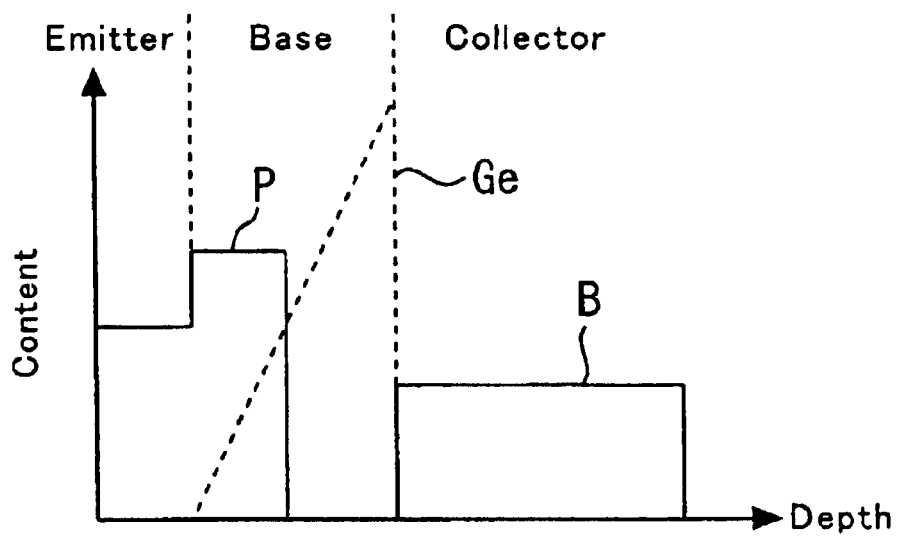
FIG. 10 is content profiles of germanium and impurities of PNP transistor according to a first embodiment of the invention.

Next, a thin oxide film having a predetermined film thickness is formed on the surface, and the oxide film on the base-forming region of the PNP transistor is selectively removed to form oxide films 150, 151, and 152 (Step 2). Then, a silicon film is deposited to show the impurity profile of FIG. 10. Namely, a P-type silicon layer, an undoped silicon-germanium layer that contains no impurities, N-type silicon-germanium layer and an N-type silicon layer are deposited in this order, and epitaxially grown (Step 3). In this time, the diffusion of impurities in the following heat treatment must be considered for the content distribution of impurities in the silicon film. In the example of FIG. 10, for instance, phosphorus is introduced in the region narrower than the base width.

Figure 6B:
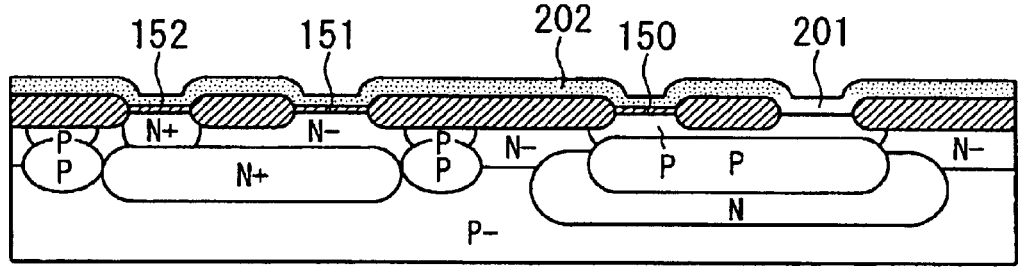

As FIG. 6(b) shows, although silicon in the base-forming region 201 of the PNP transistor is grown epitaxially, silicon in the other region 202 becomes polycrystalline. In FIG. 6(b), the polycrystalline portions are indicated by scattered dots. The region 202 may be an amorphous silicon layer.

Figure 6C:
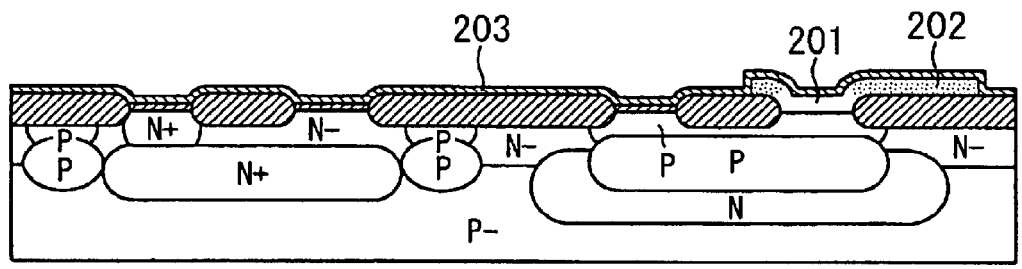
Figure 6D:
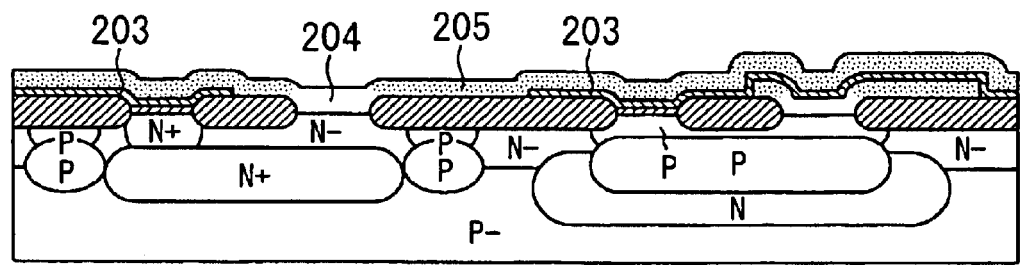
Figure 11:
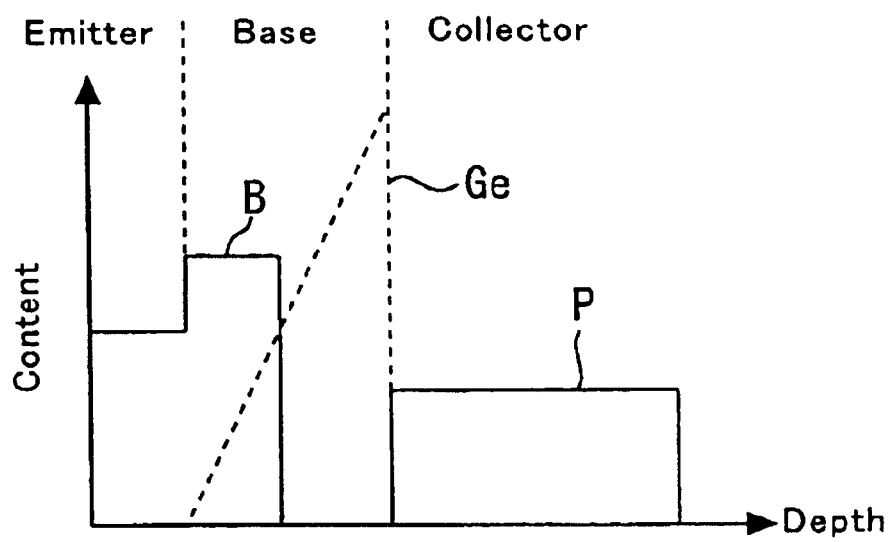
FIG. 11 is content profiles of germanium and impurities of NPN transistor according to a first embodiment of the invention.

Next, as FIG. 6(c) shows, the polycrystalline layer 202 is etched to the shape of the leading electrode of the base layer of the PNP transistor (Step 4), and an insulating film 203 is deposited on the surface, then the insulating film 203 on the base-forming region of the NPN transistor and the underlying oxide film 151 are selectively removed (Step 5). Then, a silicon film that shows the impurity profile of FIG. 11 is deposited. Namely, an N-type silicon layer, an undoped silicon-germanium layer that contains no impurities, a P-type silicon-germanium layer, and a P-type silicon layer are sequentially epitaxially grown in this order (step 6). As FIG. 6(d) shows, in the same way as in the PNP transistor as described above, although silicon in the base-forming region 204 of the NPN transistor is grown epitaxially, silicon in the other region 205 becomes polycrystalline. In FIG. 6(d), the polycrystalline portions are indicated by scattered dots. The region 205 may be an amorphous silicon layer. Considering the diffusion of impurities in the silicon layer in the following heat treatment, boron is introduced in the region narrower than the base width as the profile of FIG. 11 shows.

Figure 7A:
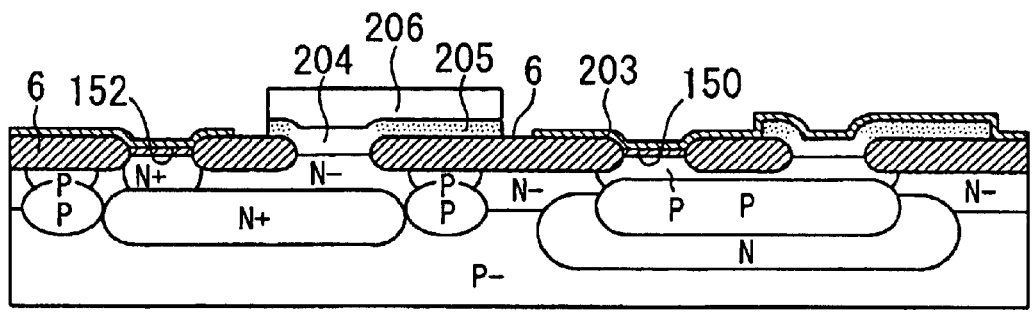
FIGS. 7A, 7B, 7C and 7D are each a schematic sectional view showing manufacturing steps of a semiconductor device according to a first embodiment of the invention.
Figure 7B:
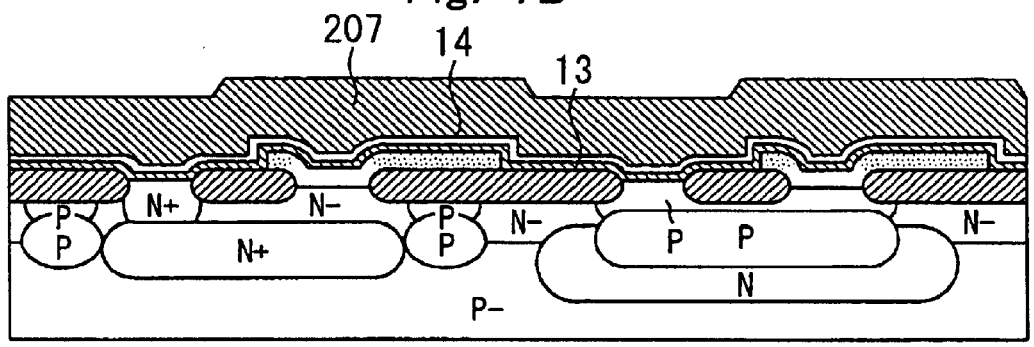

The polycrystalline layer 205 on the element isolating oxide film 6 is processed into the shape of a leading electrode of the base layer of the NPN transistor using a photoresist film 206, to form the structure shown in FIG. 7(a) (Step 7). Then, as FIG. 7(b) shows the insulating film 203 and oxide films 150 and 152 are removed, and an insulating film 13, a first polycrystalline silicon layer 14, and an oxide film (insulation film) 207 of a predetermined thickness are deposited in this order (Step 8).

Figure 7C:
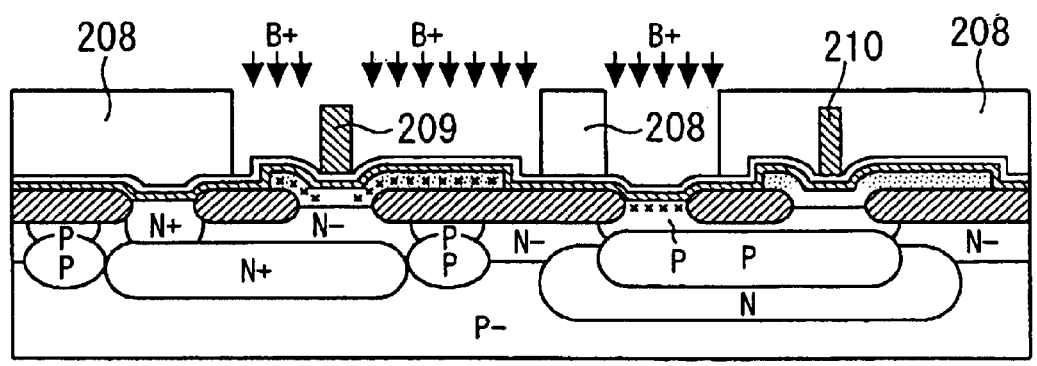

Next, the oxide film 207 of the area other than the emitter region on each of the NPN transistor and the PNP transistor is removed by etching leaving the vicinity of the emitter regions to leave the oxide film 207 on the emitter region as a pattern a little larger than the emitter region (Step 9). (Hereinafter, this pattern is referred to as an emitter pedestal.) When the base leading region including the emitter pedestal 210 of the PNP transistor and the collector contact region of the NPN transistor are coated with a photoresist 208, and the ion implantation of a P-type impurity, such as boron, is performed, boron is introduced in the regions other than the photoresist 208 and the emitter pedestal 209, as FIG. 7(c) shows (Step 10).

Figure 7D:
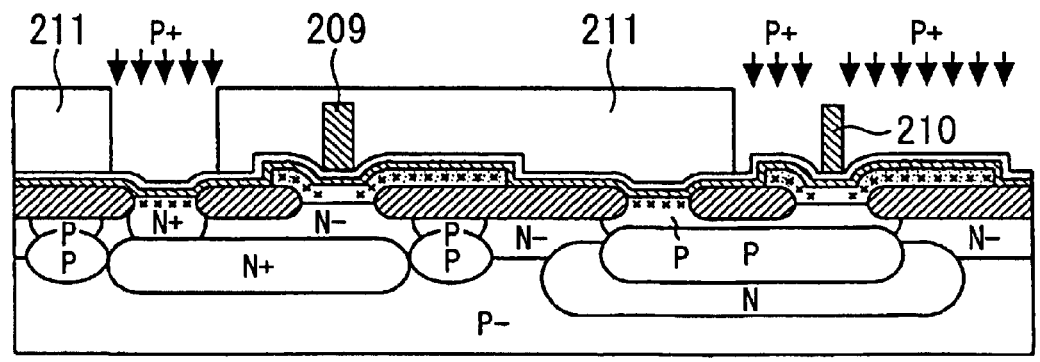
Figure 8A:
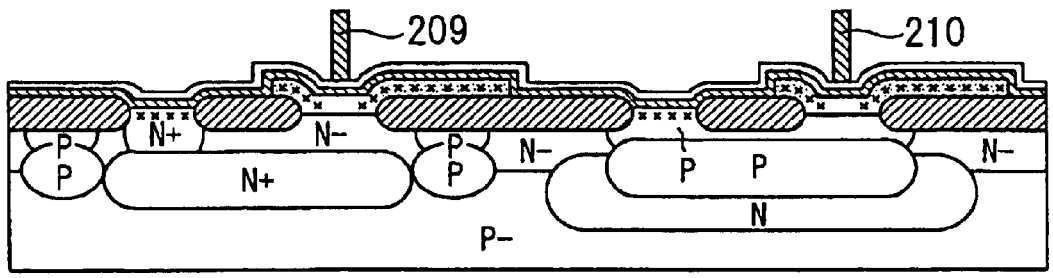
FIGS. 8A, 8B, 8C and 8D are each a schematic sectional view showing manufacturing steps of a semiconductor device according to a first embodiment of the invention.
Figure 8B:
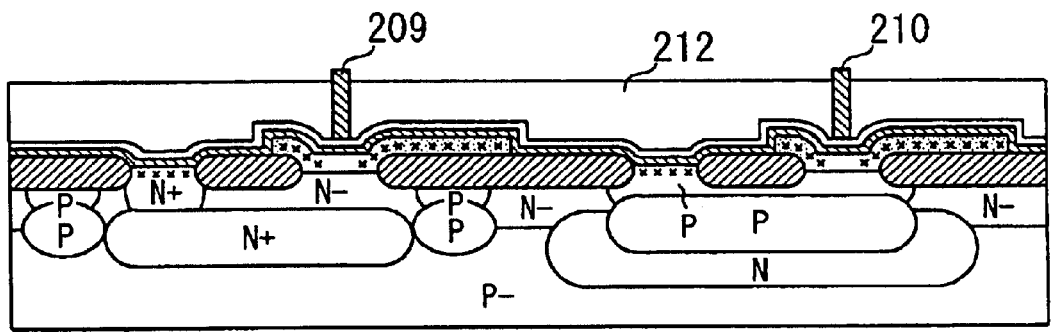
Figure 8C:
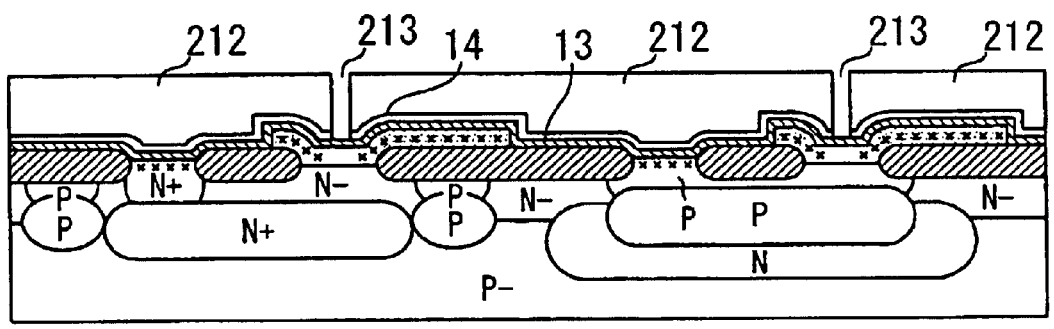

After removing the photoresist 208, the base leading region including the emitter pedestal 209 of the NPN transistor and the collector contact region of the PNP transistor are coated with a new photoresist 211, and the ion implantation of an N-type impurity, such as phosphorus, is performed, phosphorus is introduced in the regions other than the photoresist 211 and the emitter pedestal 210, as FIG. 7(d) shows (Step 11). Then, the oxide film 207 on the area other than the emitter region is removed by etching with hydrofluoric acid or the like to make emitter pedestals 209 and 210 have a substantially the same size as the emitter as FIG. 8(a) shows, a resist 212 is applied and etch back is performed to form the structure of FIG. 8(b) so that only the vicinity of the surfaces of the emitter pedestals 209 and 210 is made to be exposed, and the emitter pedestals 209 and 210 are removed using the resist (insulation film) 212 as a mask as FIG. 8(c) shows (Step 12). Next, the polycrystalline silicon layer 14 underneath the opening 213 formed after the emitter pedestals 209 and 210 have been removed is subjected to anisotropic etching, followed by the removal of the insulating film 13 underneath the polycrystalline silicon film 14 (Step 13).

Figure 8D:
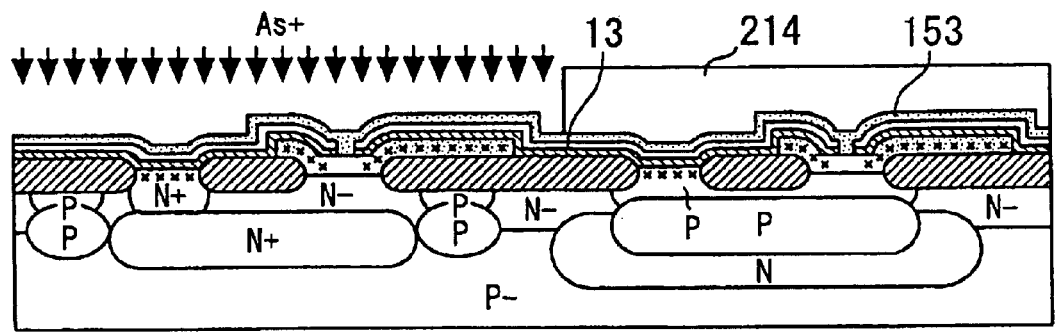
Figure 9A:
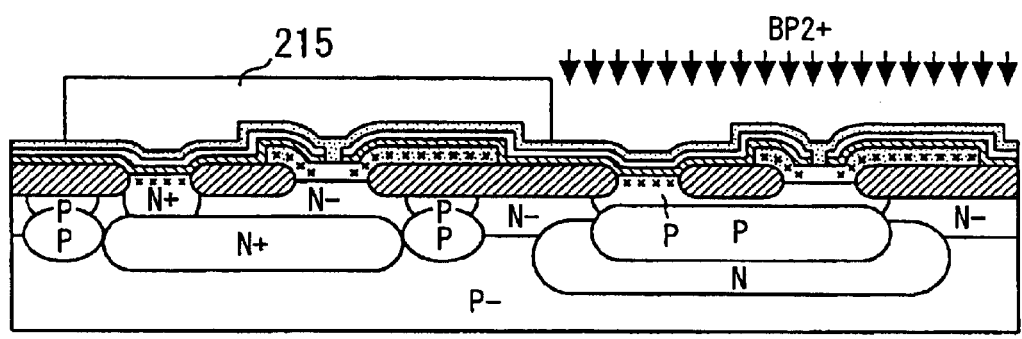
FIGS. 9A and 9B are each a schematic sectional view showing manufacturing steps of a semiconductor device according to a first embodiment of the invention.

After removing the resist 212, a second polycrystalline silicon layer 153 for leading the emitter is deposited, the PNP transistor region is coated with a photoresist 214, and as FIG. 8(d) shows, arsenic is ion-implanted as an N-type impurity in the polycrystalline silicon layer 153 on the NPN transistor region. Next, after removing the photoresist 214, the NPN transistor region is coated with a photoresist 215 anew, and as FIG. 9(a) shows, boron fluoride (BF$_2$) is ion-implanted as a P-type impurity in the polycrystalline silicon layer 153 of the PNP transistor region (Step 14).

By performing heat treatment, arsenic implanted in the polycrystalline silicon layer 153 of the NPN transistor region is diffused in the P-type base, boron fluoride implanted in the polycrystalline silicon layer 153 of the PNP transistor region is diffused in the N-type base, and the impurities implanted in the base leading portion and the collector contact portion are activated (Step 15).

Figure 9B:
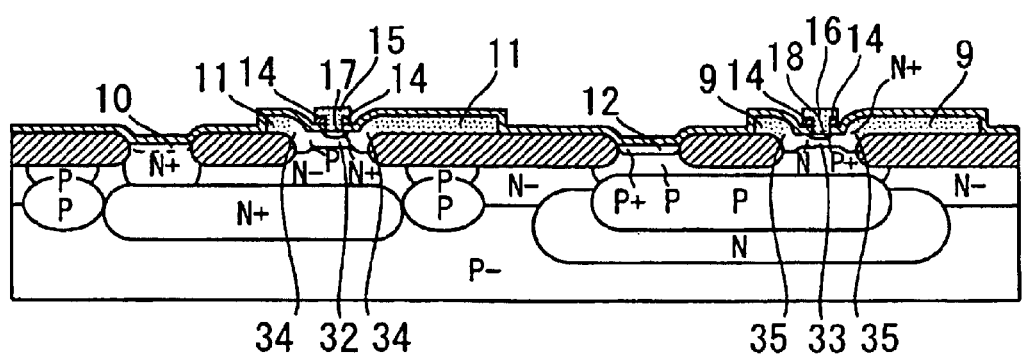

Next, as FIG. 9(b) shows, the second polycrystalline silicon and the first polycrystalline silicon are patterned together as an emitter leading electrode (Step 16). A new insulating film 19 is deposited on the surface, a contact is opened in the leading pattern of each of the emitter, base, and collector of each of the NPN transistor and the PNP transistor, and contact plugs 20, 21, 22, 23, 24, and 25, and metal electrodes 26, 27, 28, 29, 30, and 31 are formed to complete the semiconductor device according to the present invention shown in FIG. 1 (Step 17).

Second Embodiment

Figure 12A:
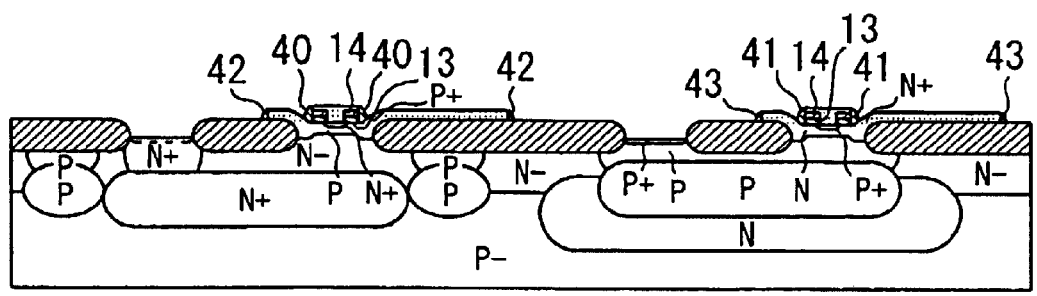
FIGS. 12A, 12B and 12C are each a schematic sectional view showing manufacturing steps of a semiconductor device according to a second embodiment of the invention.
Figure 12B:
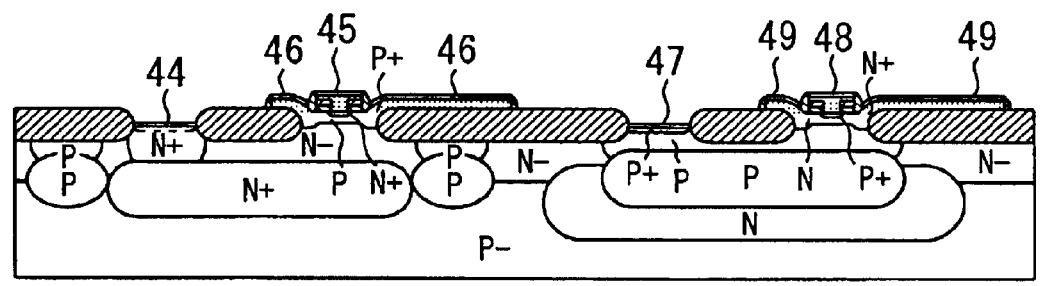
Figure 12C:
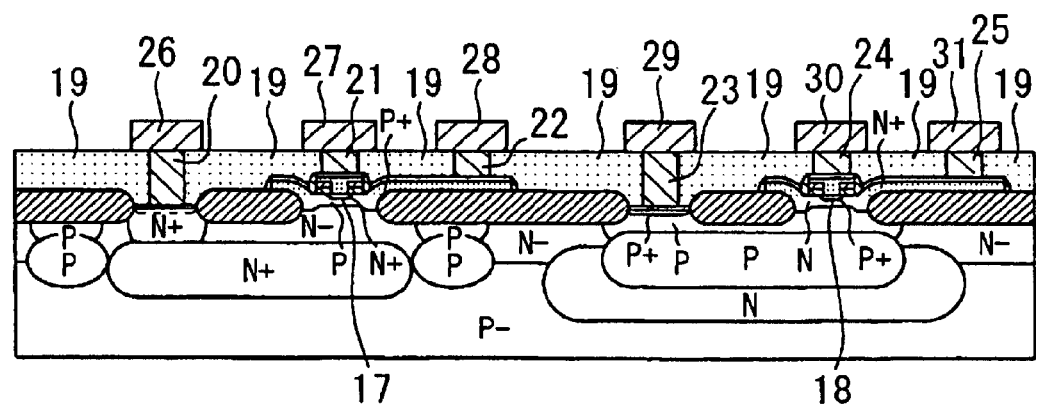

FIG. 12(c) is a sectional view of a semiconductor device according to Second Embodiment of the present invention. Unlike First Embodiment, Second Embodiment is characterized in that the surfaces of leading regions for the emitter, base and collector of both the NPN transistor and the PNP transistor are composed of silicide. In particular on the base leading region, since the area from the vicinities of emitters 17 and 18 to base contact plugs 22 and 25 is composed of silicide, the resistance of the base can be reduced significantly. Also, since the resistance of the base affects the maximum oscillation frequency $f_{max}$ and the noise factor $N_f$, the reduction of the base resistance can improve the speed performance of the semiconductor device. The content profiles of germanium and impurities are the same as the content profiles in First Embodiment.

A method for manufacturing a semiconductor device of this embodiment will be described referring to FIG. 12. First, as in First Embodiment, the steps to the step shown in FIG. 9(b) are performed, then the insulation film 13 on the area other than the region covered with polycrystalline silicon 14 is removed, and sidewalls 40, 41, 42, and 43 are formed on the sides of the emitter leading pattern and base leading pattern through the deposition of another insulating layer followed by an anisotropic etching to produce the structure shown in FIG. 12(a). When a refractory metal, such as cobalt (Co) or titanium (Ti), is sputtered on the surface and subjected to heat treatment, the refractory metal on single crystalline silicon or polycrystalline silicon reacts with silicon to form a silicide. Namely, in FIG. 12(a), silicide layers 44, 45, 46, 47, 48 and 49 are formed on the surfaces of leading regions for the emitter, base and collector, where single crystalline silicon or polycrystalline silicon is exposed on the surface, to form the structure shown in FIG. 12(a).

Next, a new insulation film 19 is deposited, a contact is opened in the leading pattern of each of the emitter, base and collector of each of the NPN transistor and the PNP transistor, and contact plugs 20, 21, 22, 23, 24 and 25, and metal electrodes 26, 27, 28, 29, 30 and 31 are formed to complete the semiconductor device according to Second Embodiment.

Third Embodiment

Figure 13B:
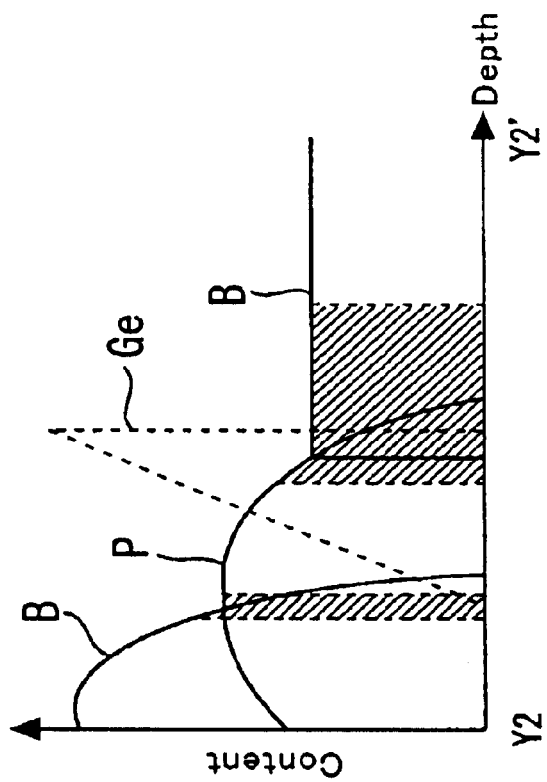
FIGS. 13A and 13B are each content profiles of germanium and impurities according to a third embodiment of the invention.
Figure 13A:
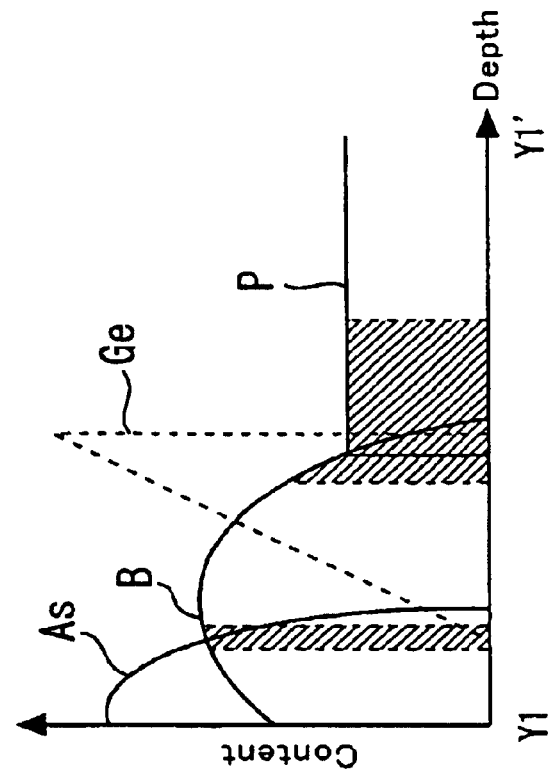

FIG. 13 shows an impurity profile according to Third Embodiment of the present invention. In Third Embodiment, both the NPN transistor and the PNP transistor are characterized in that 1) the peak of the germanium content in the base is located in the depletion layer produced by joining the base to the collector, and 2) the germanium content gradually decrease from the collector side toward the emitter side, and the point where the germanium content becomes zero is located in the depletion layer produced by joining the base to the emitter. In FIG. 13, hatched areas indicate depletion layers.

The cross-sectional structure of the semiconductor device according to Third Embodiment is similar to the cross-sectional structure of the semiconductor device according to First Embodiment or Second Embodiment. However, in order to form the epitaxial layer having an impurity profile shown in FIG. 13, Step 3 of Third Embodiment for the PNP transistor differs from Step 3 of First Embodiment, in that a P-type silicon layer, a P-type silicon-germanium layer, an undoped silicon-germanium layer that contains no impurities, an N-type silicon-germanium layer, and an N-type silicon layer are sequentially deposited in this order, and epitaxially grown. Similarly, Step 6 of Third Embodiment for the NPN transistor differs from Step 6 of First Embodiment, in that an N-type silicon layer, an N-type silicon-germanium layer, an undoped silicon-germanium layer that contains no impurities, a P-type silicon-germanium layer, and a P-type silicon layer are sequentially deposited in this order, and epitaxially grown.

Also in Third Embodiment, the PNP transistor can be produced by sequentially depositing a P-type silicon layer, a P-type silicon-germanium layer, an N-type silicon-germanium layer and an N-type silicon layer in this order, and by epitaxial growth. Similarly, the NPN transistor can be produced by sequentially depositing an N-type silicon layer, an N-type silicon-germanium layer, a P-type silicon-germanium layer and a P-type silicon layer in this order, and by epitaxial growth. Such a constitution is suitable for the case where the quantity of heat treatment in following steps is small.

In Embodiments 1 and 2, although the peak of the germanium content in the epitaxial film is located in the junction of the base and the collector, it is difficult to locate the peak in the above-described junction due to fluctuation in manufacturing. On the other hand, as FIG. 2 shows, since a high electric field is applied to the depletion layer in operation, change in the band gap affects operation very little because the peak of the germanium content is present in the depletion layer. Also, since the depletion layer has a width as thick as several hundred nanometers due to a low impurity content of the collector, locating the peak of the germanium content in the depletion layer is easier than locating it on the junction.

The same can be said for the base-emitter junction. Since the impurity content of the base and the emitter is relatively high, the width of the base-emitter junction is not wide, but since the germanium content gradually decreases, the band discontinuity, such as a spike, does not occur, and the effect on operation is small.

Therefore, according to Third Embodiment, high-frequency operation can be realized, and a semiconductor device of a high product yield can also be realized.

Fourth Embodiment

FIG. 14 shows an impurity profile according to Fourth Embodiment of the present invention. In FIG. 14, the profile has the peak value and a plateau portion of the same content as the peak value. In Fourth Embodiment, both the NPN transistor and the PNP transistor are characterized in that 1) the region having the peak of the germanium content is continuously located in the depletion layer produced by joining the base to the collector, and 2) the germanium content gradually decrease from the collector side toward the emitter side, and the point where the germanium content becomes zero is located in the depletion layer produced by joining the base to the emitter. In FIG. 14, hatched areas indicate depletion layers.

The cross-sectional structure of the semiconductor device according to Fourth Embodiment is similar to the cross-sectional structure of the semiconductor device according to First Embodiment or Second Embodiment. However, in order to form the epitaxial layer having an impurity profile shown in FIG. 14, Step 3 of Fourth Embodiment for the PNP transistor differs from Step 3 of First Embodiment, in that a P-type silicon layer, a P-type silicon-germanium layer, an undoped silicon-germanium layer that contains no impurities, an N-type silicon-germanium layer, and an N-type silicon layer are sequentially deposited in this order, and epitaxially grown. Similarly, Step 6 of Fourth Embodiment for the NPN transistor differs from Step 6 of First Embodiment, in that an N-type silicon layer, an N-type silicon-germanium layer, an undoped silicon-germanium layer that contains no impurities, a P-type silicon-germanium layer and a P-type silicon layer are sequentially deposited in this order, and epitaxially grown.

Also in Fourth Embodiment, the PNP transistor can be produced by sequentially depositing a P-type silicon layer, a P-type silicon-germanium layer, an N-type silicon-germanium layer and an N-type silicon layer in this order, and by epitaxial growth. Similarly, the NPN transistor can be produced by sequentially depositing an N-type silicon layer, an N-type silicon-germanium layer, a P-type silicon-germanium layer, and a P-type silicon layer in this order, and by epitaxial growth. Such a constitution is suitable for the case where the quantity of heat treatment in following steps is small.

In Embodiments 1 to 3, the profile of the impurity content is triangular as FIG. 5 shows, and the peak of the germanium content is only one at the predetermined depth. However, the fluctuation of the impurity contents during epitaxial growth is easy to control when the place where the peak of the germanium content is present continuously throughout a certain range. Therefore, according to Fourth Embodiment, epitaxial growth with well-controlled impurity contents can be performed.

Also, according to Fourth Embodiment, since the depletion layer formed by the base-collector junction is relatively thick, and is less sensitive to change in the band gap, a high-speed operation as in First Embodiment or Second Embodiment can be performed.

Fifth Embodiment

Figure 15A:
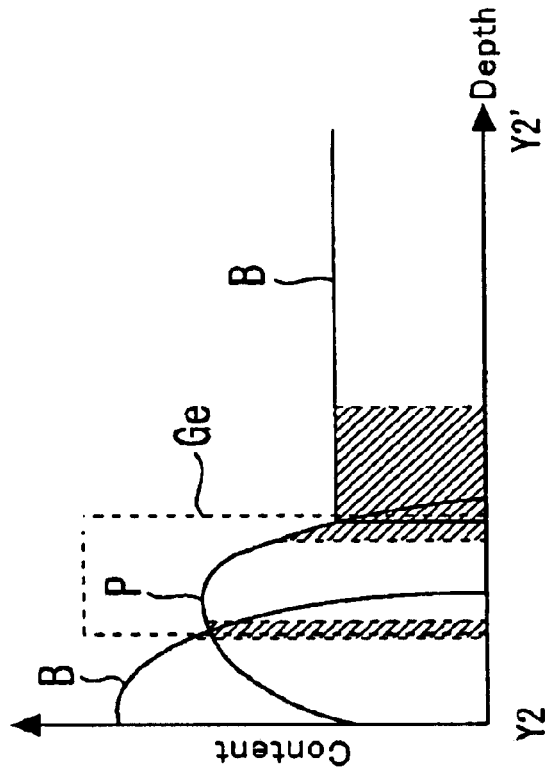
FIGS. 15A and 15B are each content profiles of germanium and impurities according to a fifth embodiment of the invention.
Figure 15B:
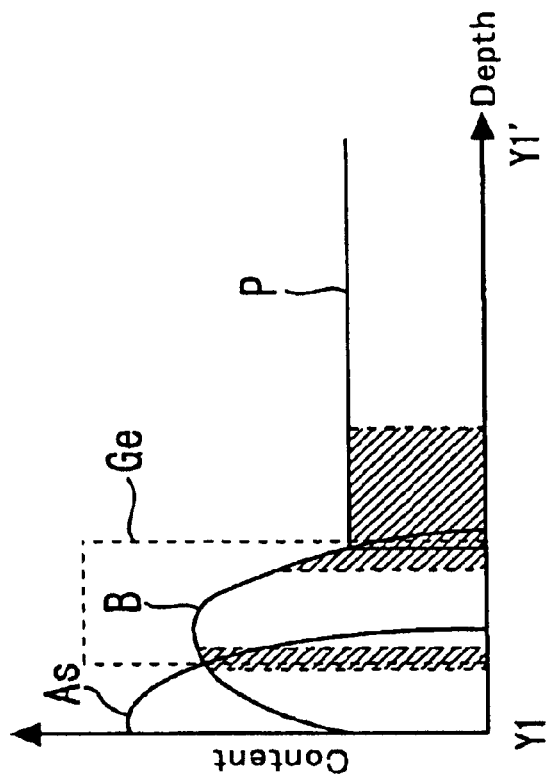

FIG. 15 shows an impurity profile according to Fifth Embodiment of the present invention. In FIG. 15, the profile of the germanium content shows a box shape wherein it takes a constant value in the base, and becomes zero steeply in the depletion layer of the collector-base junction and the depletion layer of the emitter-base junction. Namely, in Fifth Embodiment, both the NPN transistor and the PNP transistor are characterized in that 1) the germanium content takes a constant value in the base; 2) the lower end of the presence of germanium is located in the depletion layer produced by joining the base to the collector; and 3) the upper end of the presence of germanium is located in the depletion layer produced by joining the base to the emitter. Here, the lower end of the presence of germanium means the collector-side end of the region where germanium is present, and the upper end of the presence of germanium means the emitter-side end of the region where germanium is present. (hereafter the same.) In FIG. 15, hatched areas indicate depletion layers.

The cross-sectional structure of the semiconductor device according to Fifth Embodiment is similar to the cross-sectional structure of the semiconductor device according to First Embodiment or Second Embodiment. However, in order to form the epitaxial layer having an impurity profile shown in FIG. 15, Step 3 of Fifth Embodiment for the PNP transistor differs from Step 3 of First Embodiment, in that a P-type silicon layer, a P-type silicon-germanium layer, an undoped silicon-germanium layer that contains no impurities, an N-type silicon-germanium layer and an N-type silicon layer are sequentially deposited in this order, and epitaxially grown. Similarly, Step 6 of Fifth Embodiment for the NPN transistor differs from Step 6 of First Embodiment, in that an N-type silicon layer, an N-type silicon-germanium layer, an undoped silicon-germanium layer that contains no impurities, a P-type silicon-germanium layer and a P-type silicon layer are sequentially deposited in this order, and epitaxially grown.

Also in Fifth Embodiment, the PNP transistor can be produced by sequentially depositing a P-type silicon layer, a P-type silicon-germanium layer, an N-type silicon-germanium layer and an N-type silicon layer in this order, and by epitaxial growth. Similarly, the NPN transistor can be produced by sequentially depositing an N-type silicon layer, an N-type silicon-germanium layer, a P-type silicon-germanium layer and a P-type silicon layer in this order, and by epitaxial growth. Such a constitution is suitable for the case where the quantity of heat treatment in following steps is small.

In Embodiments 1 and 2, the profile of the germanium contents in the base is a graded type wherein the germanium content decreases gradually from the collector side toward the emitter side. Although such a constitution is effective for realizing a high-speed performance, some applications require a transistor having a high gain rather than a high-speed performance. In order to realize a transistor having a high gain, it is effective to provide a band-gap difference in the base-emitter junction to reduce the quantity of movement of minority carriers against majority carriers. Therefore, the profile of the germanium contents in Fifth Embodiment is a profile of a box type as described above. Thereby a transistor having a high gain can be obtained.

Also, according to Fifth Embodiment, since the depletion layer formed by the base-collector junction is relatively thick, and is less sensitive to change in the band gap, a high-speed operation as in First Embodiment or Second Embodiment can be performed.

Sixth Embodiment

Figure 16B:
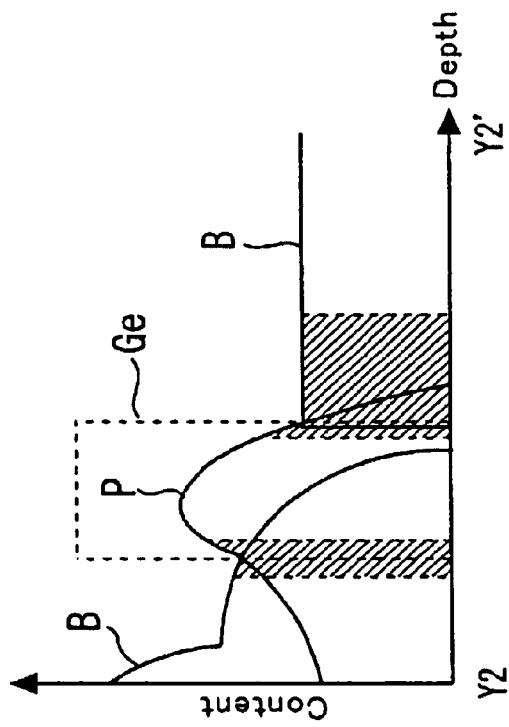
FIGS. 16A and 16B are each content profiles of germanium and impurities according to a sixth embodiment of the invention.
Figure 16A:
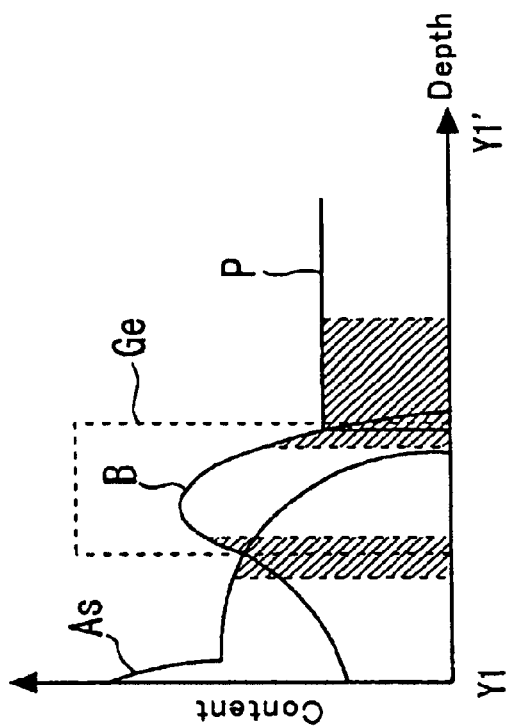
Figure 17:
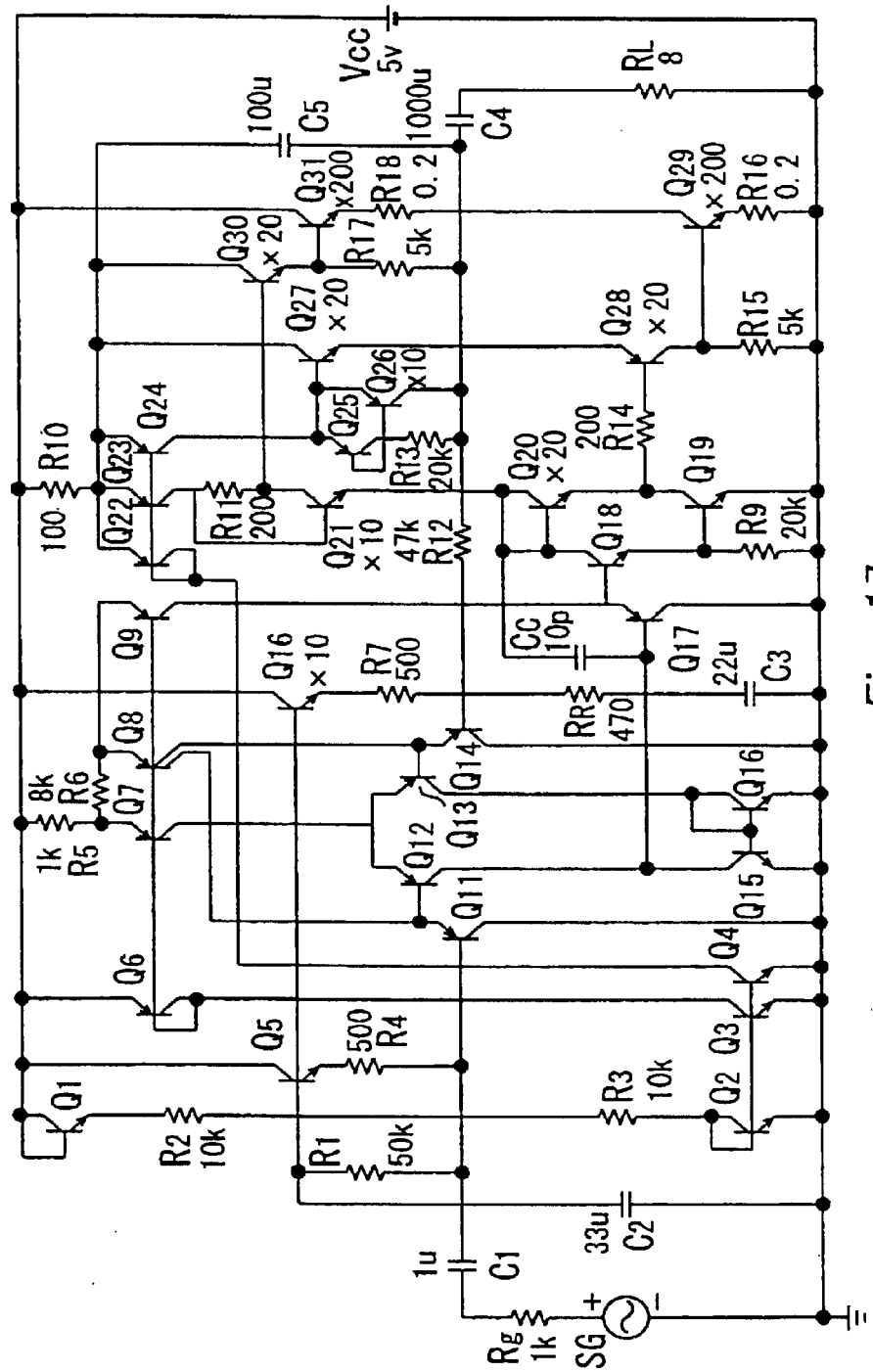
FIG. 17 is a circuit constitution of a high-power amplifier of a conventional push-pull constitution.
Figure 18:
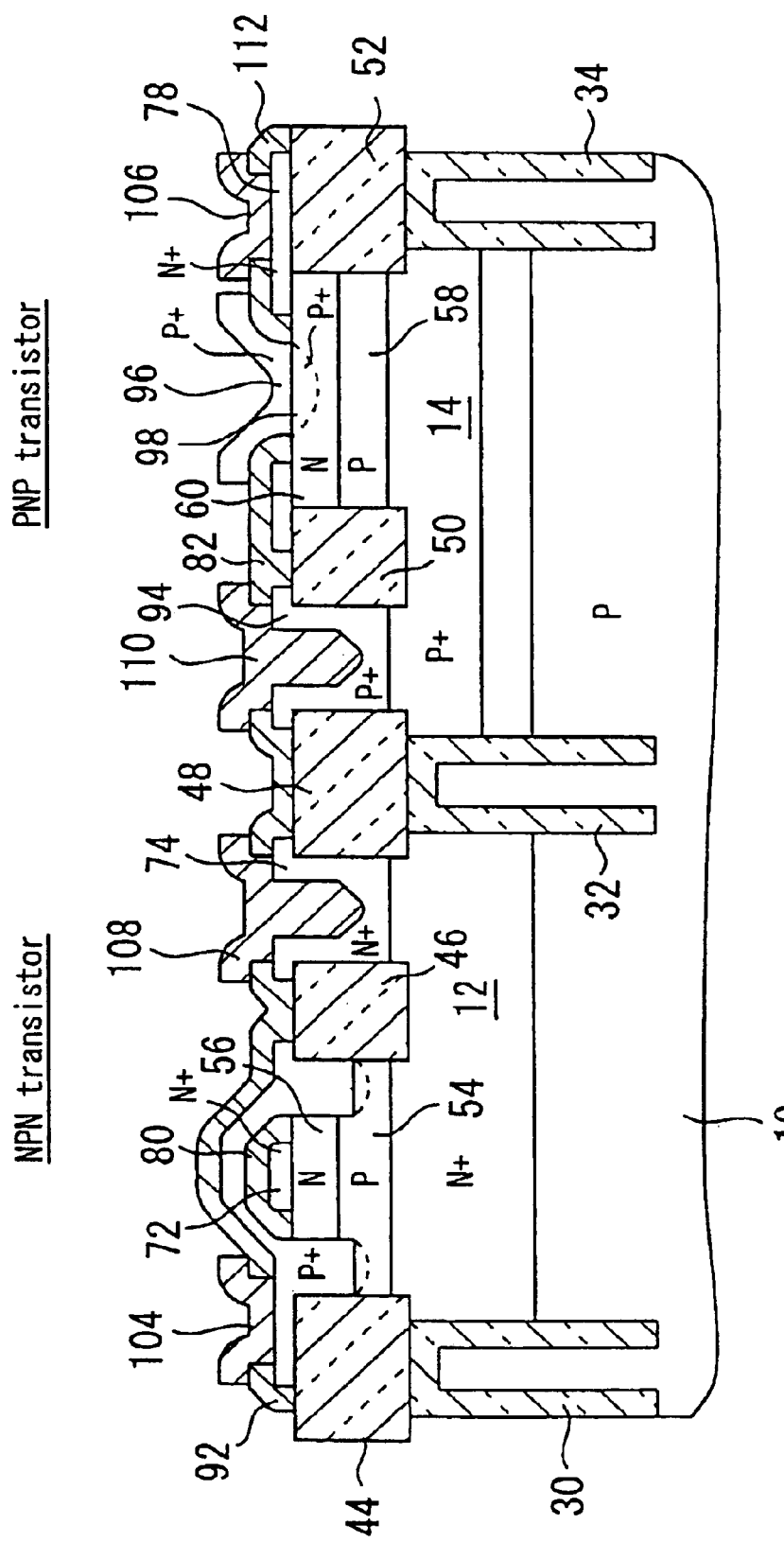
FIG. 18 is a sectional view of a conventional semiconductor device.
Figure 19:
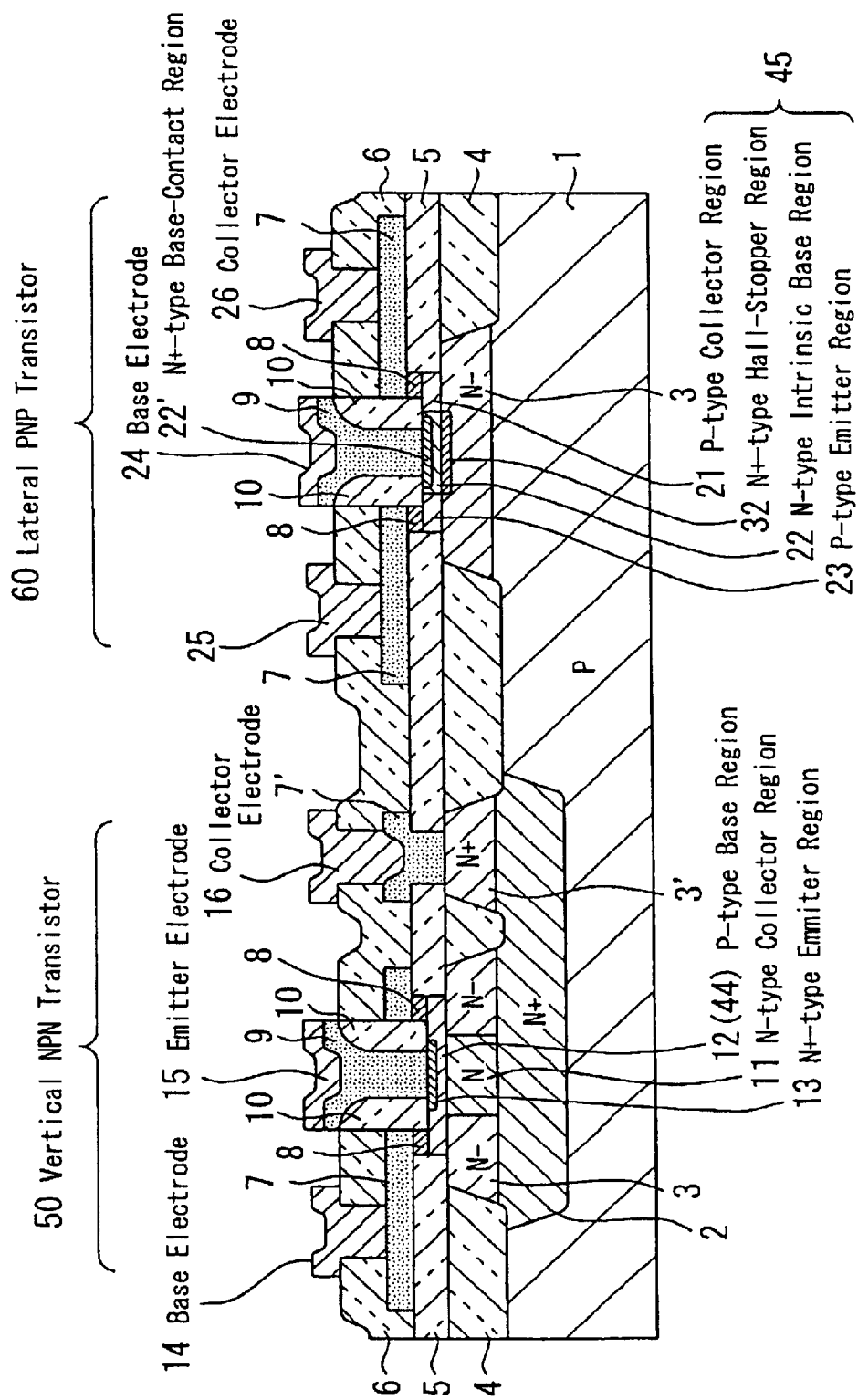
FIG. 19 is a sectional view of a conventional semiconductor device.
Figure 20:
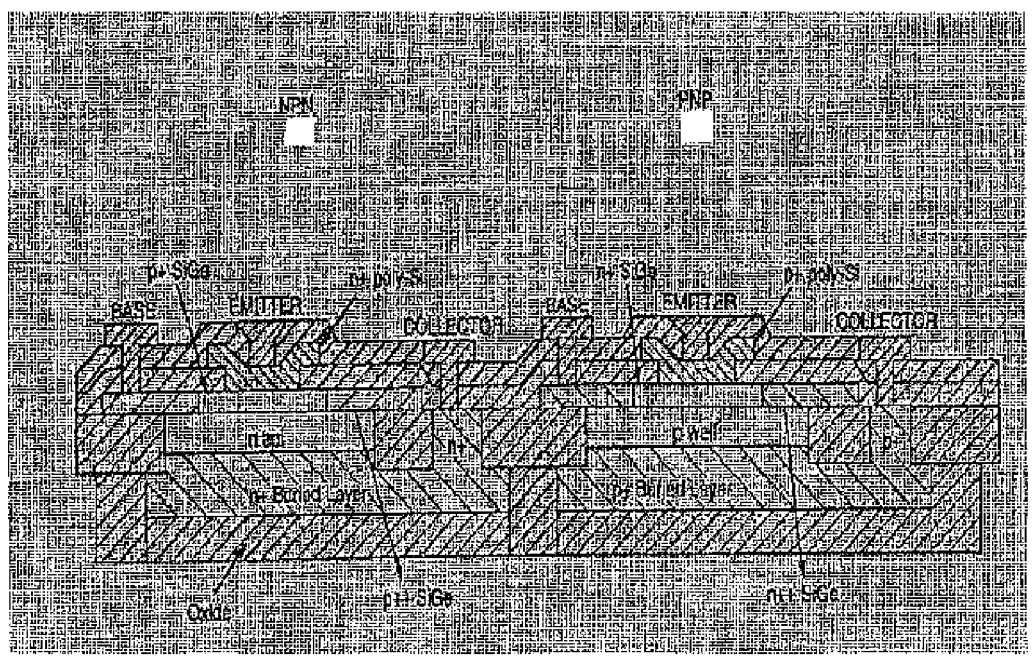
FIG. 20 is a sectional view of a conventional semiconductor device.

FIG. 16 shows an impurity profile according to Sixth Embodiment of the present invention. In FIG. 16, the germanium content profile shows a box shape. In Sixth Embodiment, both the NPN transistor and the PNP transistor are characterized in that 1) the germanium content takes a constant value in the base; 2) the lower end of the presence of germanium is located in the depletion layer produced by joining the base to the collector; 3) the upper end of the presence of germanium is located in the depletion layer produced by joining the base to the emitter; and 4) the impurity content of the emitter in the vicinity of the base-emitter junction is the same as or lower than the impurity content of the base. The cross-sectional structure of the semiconductor device according to Sixth Embodiment is the same as the cross-sectional structure of First Embodiment or Second Embodiment. In FIG. 16, hatched areas indicate depletion layers.

In Sixth Embodiment, the profile of germanium contents is a box type as in Fifth Embodiment. However, since the width of the depletion layer is narrowed when the impurity content of the emitter and the impurity content of the base are high, there is a small margin if the upper end of the region where germanium is present is located in the depletion layer. On the other hand, if the emitter-base junction is a hetero junction, since the gain can be increased by making band-gap difference, the impurity content of the emitter is not necessarily higher than the impurity content of the base. Therefore, Sixth Embodiment is characterized in that the depletion layer is extended toward the emitter side by lowering the impurity content of the emitter. Thereby, since it becomes easy to dispose the upper end of the region where germanium is present in the depletion layer, the product yield can be improved, and since the base-emitter junction capacity is reduced, the speed performance can be improved.

Seventh Embodiment

Seventh Embodiment is characterized in that the impurity profiles of the NPN transistor and the PNP transistor are optional different combination selected from the impurity profiles shown in FIGS. 13 to 16. The cross-sectional structure of the semiconductor device according to Seventh Embodiment is the same as the cross-sectional structure of First Embodiment or Second Embodiment.

According to Seventh Embodiment, for example, when an NPN transistor that enables high-speed operation and a PNP transistor having a large gain are required, a desired circuit constitution can be obtained while maintaining a manufacturing margin by selecting an impurity profile optimal for each of the NPN transistor and the PNP transistor.

The features and advantages of the present invention may be summarized as follows.

According to one aspect of the invention, since each of the P-type base layer of the NPN transistor and the N-type base layer of the PNP transistor contains impurities in the impurity profile in the corresponding epitaxial layer, and an optimal base width can be configured for each of the NPN transistor and the PNP transistor, a high-speed performance can be realized while maintaining a practical withstand voltage.

According to another aspect of the invention, a semiconductor that can be manufactured by a simple process can be realized.

According to other aspect of the invention, the resistance of the base can be reduced, and a high-speed performance can be realized.

According to other aspect of the invention, a high-frequency operation can be realized.

According to other aspect of the invention, a high-frequency operation can be realized, and a semiconductor device with a high product yield can also be realized.

According to other aspect of the invention, an epitaxial layer with a good controllability of impurity contents can be realized, and a semiconductor device that enables a high-speed operation can also be realized.

According to other aspect of the invention, a semiconductor device having a large gain can be realized.

According to other aspect of the invention, a semiconductor device that improves the product yield, and that improves speed performance by reducing the base-emitter junction capacity can be realized.

According to other aspect of the invention, since an optimal base width can be configured for each of the NPN transistor and the PNP transistor, a semiconductor device that can realize a high-speed performance while maintaining a practical withstand voltage can be manufactured.

According to other aspect of the invention, since the resistance of the base can be reduced, a semiconductor device having a high-speed performance can be manufactured.

According to other aspect of the invention, a semiconductor device that can realize a high-frequency operation can be manufactured.

According to other aspect of the invention, since the locations where the germanium content is maximum and minimum in the depletion layer can be provided, an epitaxial layer with a good controllability of impurity contents can be formed, and a semiconductor device that enables a high-speed operation can be manufactured.

According to still other aspect of the invention, since the locations where the germanium content is maximum and minimum in the depletion layer can be provided, an epitaxial layer with a good controllability of impurity contents can be formed, and a semiconductor device that enables a high-speed operation can be manufactured. Also, the temperature of heat treatment can be lowered.

For further reference, a method of manufacturing a semiconductor device having a vertical bipolar transistor of a first type and a vertical bipolar transistor of a second type on a common silicon substrate, according to the present invention may be summarized as follows.

According to one aspect, the method comprises the steps of: forming on said silicon substrate a first buried collector region of said vertical bipolar transistor of the first type, a second buried collector region of said vertical bipolar transistor of the second type, a first epitaxial layer, and an element isolating region for electrically insulating and isolating these bipolar transistors; forming a first insulating film on the surface of a first epitaxial layer, and removing the first insulating film on said first buried collector region; depositing a silicon layer of the first conductivity type, an undoped silicon germanium layer, a silicon germanium layer of the second conductivity type and a silicon layer of the second conductivity type in this order on the surface of the first epitaxial layer wherefrom the first insulating film on said first buried collector region has been removed, to form a second epitaxial layer; patterning said second epitaxial layer to a form of a leading electrode of the base layer of said vertical bipolar transistor of the first type; forming a second insulating film on the surface of said patterned second epitaxial layer, and removing said second insulating film and said first insulating film on said second buried collector region; depositing a silicon layer of the second conductivity type, an undoped silicon germanium layer, a silicon germanium layer of the first conductivity type and a silicon layer of the first conductivity type in this order on the surface of the first epitaxial layer wherefrom said second insulating film and said first insulating film on said second buried collector region have been removed, to form a third epitaxial layer; patterning said third epitaxial layer to a form of a leading electrode of the base layer of said vertical bipolar transistor of the second type; and introducing an impurity of the first conductivity type into said silicon layer of the second conductivity type of said second epitaxial layer, and introducing an impurity of the second conductivity type into said silicon layer of the first conductivity type of said third epitaxial layer.

Preferably, the step for introducing an impurity of the first conductivity type into said silicon layer of the second conductivity type of said second epitaxial layer, and introducing an impurity of the second conductivity type into said silicon layer of the first conductivity type of said third epitaxial layer comprises the steps of: removing said second insulating film on said second epitaxial layer, and depositing on it a third insulating film, a first semiconductor layer and a fourth insulating film in this order; removing said fourth insulating film on the area other than the area on the emitter region of each of said vertical bipolar transistor of the first type and said vertical bipolar transistor of the second type, leaving the vicinity of said emitter regions; introducing an impurity of the second conductivity type into said second epitaxial layer using said fourth insulating film as a mask; introducing an impurity of the first conductivity type into said third epitaxial layer using said fourth insulator film as a mask; removing said fourth insulation film on the area other than the area on the emitter regions, forming a fifth insulation film that covers the area other than said fourth insulating film on the surface thereof and removing said fourth insulating film; forming an opening in said first semiconductor layer and said third insulating film using said fifth insulation film as a mask; depositing a second semiconductor layer so as to contact said opening, introducing an impurity of the first conductivity type into said second semiconductor layer on said second epitaxial layer, and introducing an impurity of the second conductivity type into said second semiconductor layer on said third epitaxial layer; and performing heat treatment for introducing said impurity of the first conductivity type into said silicon layer of the second conductivity type of said second epitaxial layer and introducing said impurity of the second conductivity type into said silicon layer of the first conductivity type of said third epitaxial layer.

Preferably, the method further comprises, after said heat treatment, a step for forming a silicide layer on the leading electrode of the base layer of each of said vertical bipolar transistor of the first type and said vertical bipolar transistor of the second type.

Preferably, said second epitaxial layer is formed so that the germanium concentration becomes a maximum at an interface between said silicon layer of the first conductivity type and said undoped silicon germanium layer, and becomes a minimum at an interface between said silicon germanium layer of the second conductivity type and said silicon layer of the second conductivity type.

Preferably, said third epitaxial layer is formed so that the germanium concentration becomes a maximum at the interface between said silicon layer of the second conductivity type and said undoped silicon germanium layer, and becomes a minimum at the interface between said silicon layer of the first conductivity type and said silicon germanium layer of the first conductivity type.

According to another aspect, the method comprises the steps of: forming on said silicon substrate the first buried collector region of said vertical bipolar transistor of the first type, the second buried collector region of said vertical bipolar transistor of the second type, a first epitaxial layer, and an element isolating region for electrically insulating and isolating these bipolar transistors; forming a first insulating film on the surface of a first epitaxial layer, and removing the first insulating film on said first buried collector region; depositing a silicon layer of the first conductivity type, a silicon germanium layer of the first conductivity type, an undoped silicon germanium layer, a silicon germanium layer of the second conductivity type and a silicon layer of the second conductivity type in this order on the surface of the first epitaxial layer wherefrom the first insulating film on said first buried collector region has been removed, to form a second epitaxial layer; patterning said second epitaxial layer to a form of a leading electrode of the base layer of said vertical bipolar transistor of the first type; forming a second insulating film on the surface of said patterned second epitaxial layer, and removing said second insulating film and said first insulating film on said second buried collector region; depositing a silicon layer of the second conductivity type, a silicon germanium layer of the second conductivity type, an undoped silicon germanium layer, a silicon germanium layer of the first conductivity type and a silicon layer of the first conductivity type in this order on the surface of the first epitaxial layer wherefrom said second insulating film and said first insulating film on said second buried collector region have been removed, to form a third epitaxial layer; patterning said third epitaxial layer to a form of a leading electrode of the base layer of said vertical bipolar transistor of the second type; and introducing an impurity of the first conductivity type into said silicon layer of the second conductivity type of said second epitaxial layer, and introducing an impurity of the second conductivity type into said silicon layer of the first conductivity type of said third epitaxial layer.

According to another aspect, the method comprises the steps of: forming on said silicon substrate a first buried collector region of said vertical bipolar transistor of the first type, the second buried collector region of said vertical bipolar transistor of the second type, a first epitaxial layer, and an element isolating region for electrically insulating and isolating these bipolar transistors; forming a first insulating film on the surface of a first epitaxial layer, and removing the first insulating film on said first buried collector region; depositing a silicon layer of the first conductivity type, a silicon germanium layer of the first conductivity type, a silicon germanium layer of the second conductivity type and a silicon layer of the second conductivity type in this order on the surface of the first epitaxial layer wherefrom the first insulating film on said first buried collector region has been removed, to form a second epitaxial layer; patterning said second epitaxial layer to a form of a leading electrode of the base layer of said vertical bipolar transistor of the first type; forming a second insulating film on the surface of said patterned second epitaxial layer, and removing said second insulating film and said first insulating film on said second buried collector region; depositing a silicon layer of the second conductivity type, a silicon germanium layer of the second conductivity type, a silicon germanium layer of the first conductivity type, and a silicon layer of the first conductivity type in this order on the surface of the first epitaxial layer wherefrom said second insulating film and said first insulating film on said second buried collector region have been removed, to form a third epitaxial layer; patterning said third epitaxial layer to a form of a leading electrode of the base layer of said vertical bipolar transistor of the second type; and introducing an impurity of the first conductivity type into said silicon layer of the second conductivity type of said second epitaxial layer, and introducing an impurity of the second conductivity type into said silicon layer of the first conductivity type of said third epitaxial layer.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-92622, filed on Mar. 28, 2002 including specification, claims, drawings and summary, on which the Convention priority of the present application is based, are incorporated herein by reference in its entirety.

What is claimed is:

1. A semiconductor device comprising:
 a vertical NPN bipolar transistor and a vertical PNP bipolar transistor each having a collector layer, a base layer, and an emitter layer formed on a common silicon substrate, wherein each of said vertical NPN bipolar transistor and said vertical PNP bipolar transistor comprises a first epitaxial layer formed on the surface of said silicon substrate, an isolation insulating film disposed on the surface of said first epitaxial layer, a first portion of said collector layer formed on the surface of said first epitaxial layer and surrounded by said isolation insulating film, and a second epitaxial layer extending on said first epitaxial layer and said isolation insulating film; and wherein said second epitaxial layer comprises a silicon layer as a second portion of said collector layer, a silicon germanium layer as said base layer, and a silicon layer as said emitter layer in the order from the bottom.

2. The semiconductor device according to claim 1, wherein each of said second epitaxial layers forms a polycrystalline silicon layer or an amorphous silicon layer on said isolation insulating film, and said polycrystalline silicon layer or said amorphous silicon layer composes a leading electrode of said base layer.

3. The semiconductor device according to claim 1, wherein a suicide layer is formed on a leading electrode of said base layer.

4. The semiconductor device according to claim 1, wherein the germanium concentration in the base layer of said vertical PNP bipolar transistor is gradually descended from said collector side toward said emitter side so as to be maximum at a junction between said collector layer and said base layer, and to be minimum at a junction between said emitter layer and said base layer.

5. The semiconductor device according to claim 1, wherein the germanium concentration in the base layer of said vertical PNP bipolar transistor is gradually descended from said collector side toward said emitter side so as to be maximum in a depletion layer formed at a junction of said collector layer and said base layer, and to be minimum in a depletion layer formed at a junction of said emitter layer and said base layer.

6. The semiconductor device according to claim 1, wherein the germanium concentration in the base layer of said vertical PNP bipolar transistor is gradually descended from said collector side toward said emitter side so as to take a maximum value having a certain width in a depletion layer formed at a junction of said collector layer and said base layer, and to be minimum in a depletion layer formed at a junction of said emitter layer and said base layer.

7. The semiconductor device according to claim 1, wherein the germanium concentration in the base layer of said vertical PNP bipolar transistor is constant in said base, and descends steeply to a minimum in a depletion layer formed at a junction of said collector layer and said base layer, and in a depletion layer formed at a junction of said emitter layer and said base layer.

8. The semiconductor device according to claim 7, wherein an impurity concentration in said emitter in the vicinity of the junction between said base layer and said emitter layer of said vertical PNP bipolar transistor is the same as or lower than an impurity concentration in said base.

* * * * *